United States Patent
Akiyama et al.

(10) Patent No.: US 8,553,125 B2
(45) Date of Patent: Oct. 8, 2013

(54) SOLID-STATE IMAGE SENSOR AND CAMERA HAVING IMAGE SENSOR WITH PLANARIZED INSULATIVE FILM

(75) Inventors: Takeshi Akiyama, Kawasaki (JP); Hiroaki Naruse, Yokohama (JP); Junji Iwata, Yokohama (JP); Yasushi Matsuno, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 40 days.

(21) Appl. No.: 13/159,518

(22) Filed: Jun. 14, 2011

(65) Prior Publication Data
US 2012/0002070 A1  Jan. 5, 2012

(30) Foreign Application Priority Data
Jun. 30, 2010  (JP) .................................. 2010-150252

(51) Int. Cl.
*H04N 5/335* (2011.01)
*H01L 31/062* (2012.01)

(52) U.S. Cl.
USPC .......................................... 348/308; 257/291

(58) Field of Classification Search
USPC .......................................... 348/294; 257/291
See application file for complete search history.

(56) References Cited

U.S. PATENT DOCUMENTS

| | | | | |
|---|---|---|---|---|
| 6,433,438 | B2* | 8/2002 | Koubuchi et al. | 257/776 |
| 6,606,124 | B1* | 8/2003 | Hatano et al. | 348/311 |
| 7,009,233 | B2* | 3/2006 | Uchiyama et al. | 257/296 |
| 7,619,269 | B2 | 11/2009 | Ohkawa | 257/296 |
| 7,759,222 | B2* | 7/2010 | Morii et al. | 438/462 |
| 2002/0067419 | A1* | 6/2002 | Inoue et al. | 348/333.03 |
| 2003/0166322 | A1* | 9/2003 | Kasuya | 438/284 |
| 2010/0013975 | A1* | 1/2010 | Nakashima et al. | 348/308 |
| 2010/0026866 | A1* | 2/2010 | Matsumoto et al. | 348/308 |
| 2010/0214457 | A1* | 8/2010 | Sakai | 348/294 |

FOREIGN PATENT DOCUMENTS

| | | |
|---|---|---|
| JP | 2008-060357 A | 3/2008 |
| JP | 2008-098373 A | 4/2008 |
| JP | 2010-056515 A | 3/2010 |

* cited by examiner

*Primary Examiner* — Aung S Moe
*Assistant Examiner* — Amy Hsu
(74) *Attorney, Agent, or Firm* — Fitzpatrick, Cella, Harper & Scinto

(57) ABSTRACT

A solid-state image sensor having a pixel array area where a plurality of pixels are arranged, and a peripheral circuit area, each pixel including a photoelectric converter, and a transfer gate electrode which forms a channel for transferring charges generated by the photoelectric converter to a floating diffusion portion, comprises a first insulating film arranged to cover an upper surface of the photoelectric converter, at least part of an upper surface of the transfer gate electrode, and a side surface of the transfer gate electrode, a second insulating film arranged on a gate electrode of a MOS transistor arranged in the peripheral circuit area, and an interlayer insulating film arranged in contact with the first insulating film and the second insulating film.

20 Claims, 7 Drawing Sheets

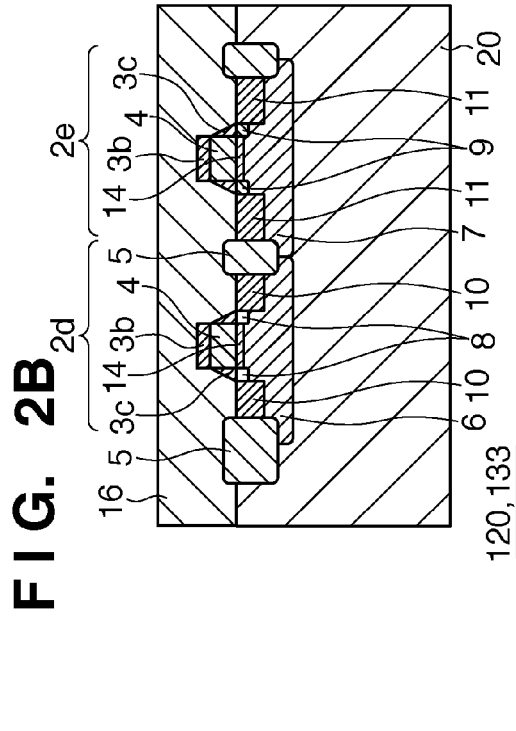
FIG. 2A
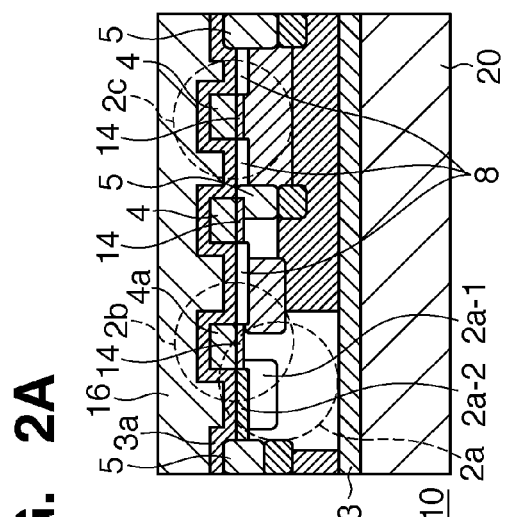
FIG. 2B
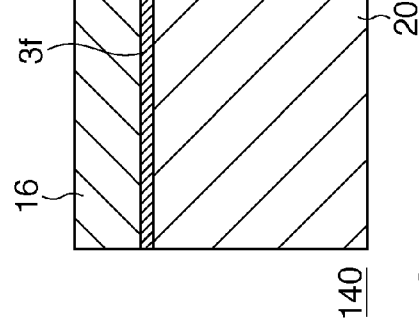
FIG. 2E
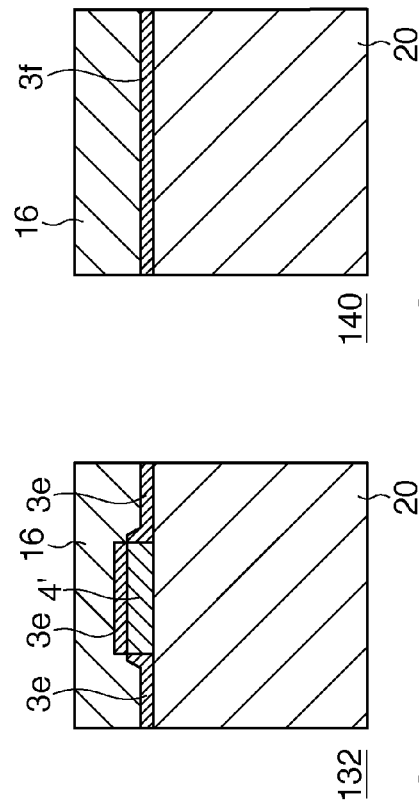
FIG. 2C
FIG. 2D

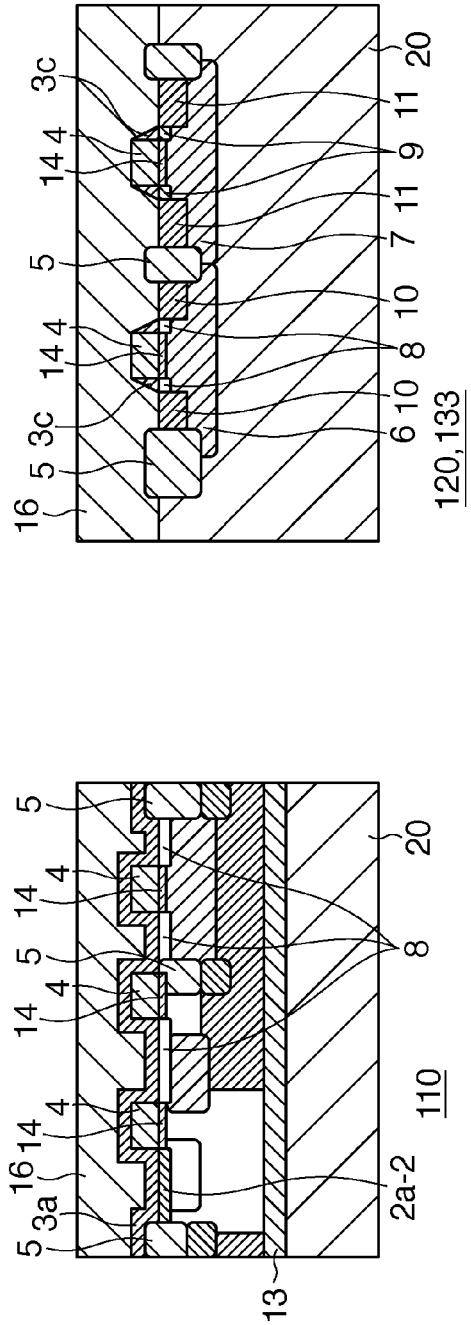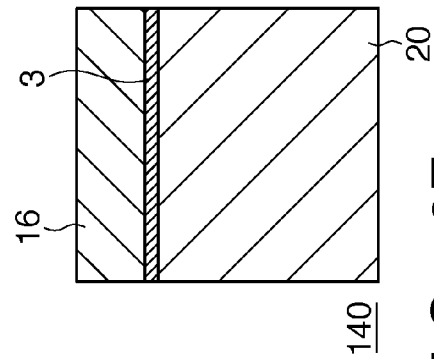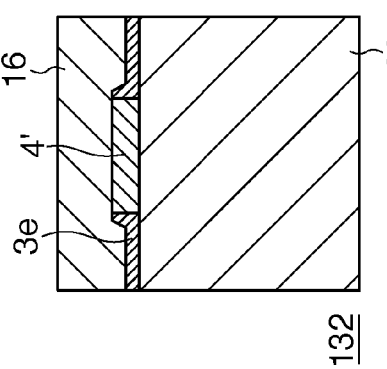

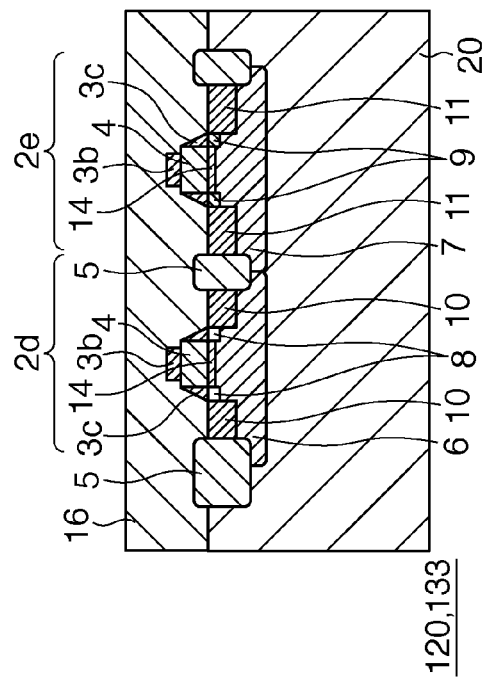
FIG. 4A
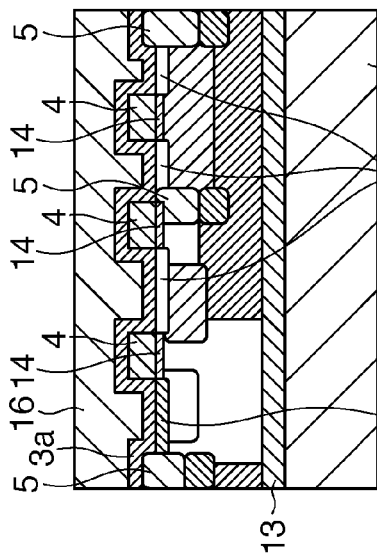
FIG. 4B
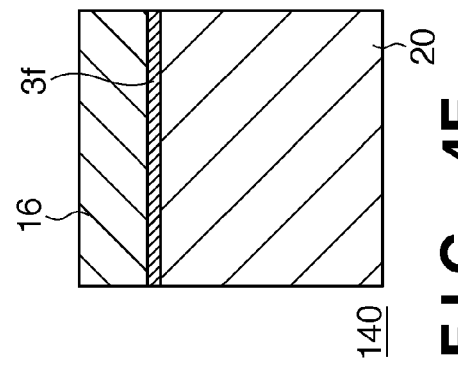
FIG. 4E
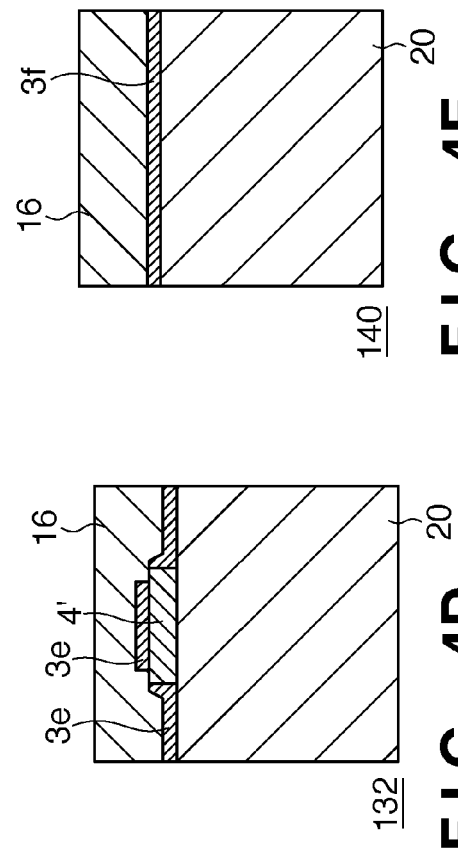
FIG. 4C
FIG. 4D

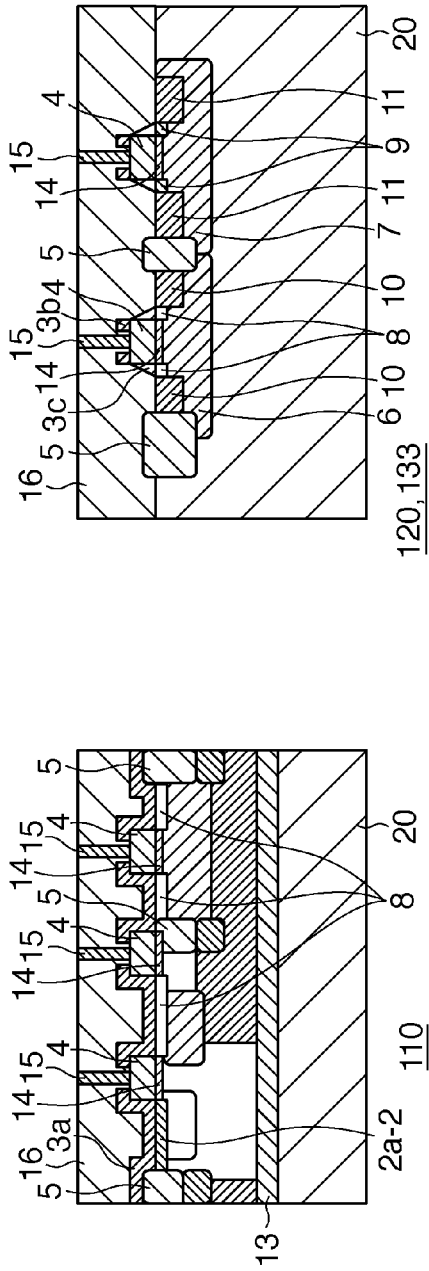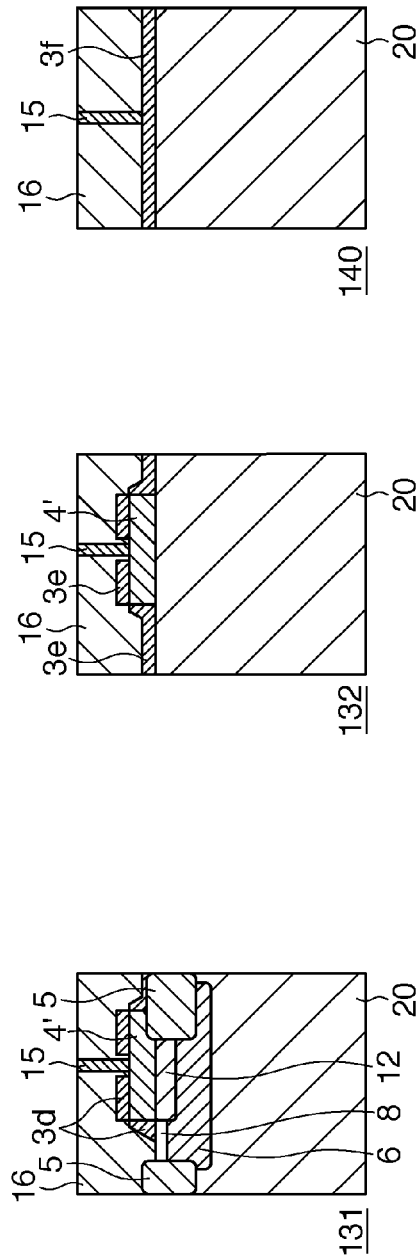

F I G. 7
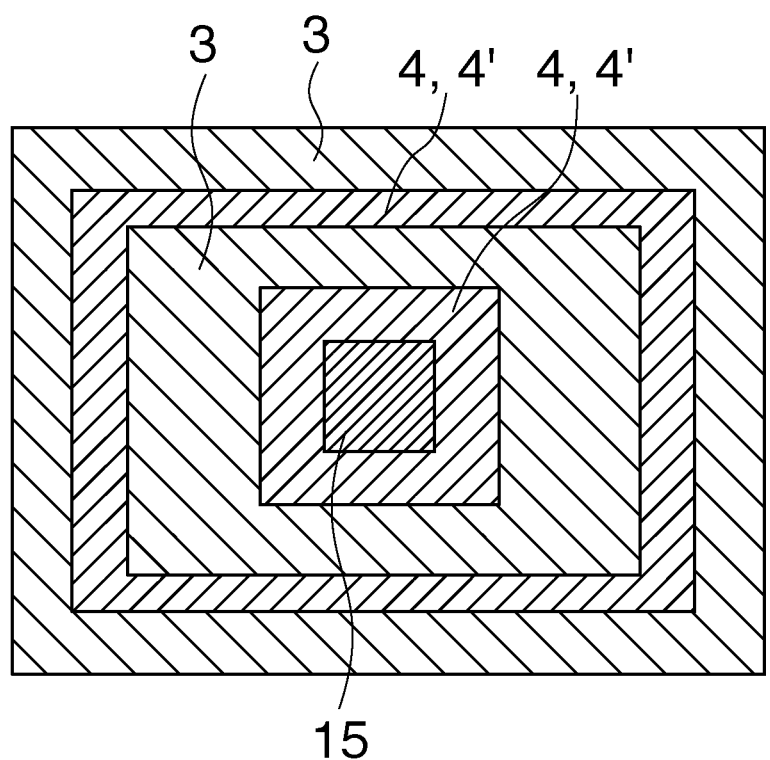

SOLID-STATE IMAGE SENSOR AND CAMERA HAVING IMAGE SENSOR WITH PLANARIZED INSULATIVE FILM

BACKGROUND OF THE INVENTION

1. Field of the Invention

The present invention relates to a solid-state image sensor and a camera in which it is included.

2. Description of the Related Art

A planarization technique called CMP (Chemical Mechanical Polishing) is used to planarize the surface of an interlayer insulating film in a solid-state image sensor. Japanese Patent Laid-Open No. 2008-098373 discloses a technique of reducing a global step serving as the level difference of the surface of an interlayer insulating film on the entire chip. More specifically, Japanese Patent Laid-Open No. 2008-098373 discloses a technique of simultaneously forming an insulating film which covers photodiodes in the pixel area and an insulating film which covers dummy gate electrodes in the peripheral circuit area and scribe lane area, and forming an interlayer insulating film on these insulating films. Dummy gate electrodes arranged in the peripheral circuit area are formed in a space where the gate electrodes and wiring lines of MOS transistors are not dense. The insulating film which is formed in the peripheral circuit area at the same time as the insulating film covering photodiodes is not formed on the gate electrodes of MOS transistors arranged in the peripheral circuit area.

In a solid-state image sensor disclosed in Japanese Patent Laid-Open No. 2008-098373, the insulating film which is formed in the peripheral circuit area at the same time as the insulating film covering photodiodes is formed neither on the gate electrodes of MOS transistors in the peripheral circuit area nor in the space where polysilicon wiring lines are not dense. Thus, the coverage of the semiconductor substrate by the protective film differs between the pixel area and the peripheral circuit area, and, though allowable, a global step may remain. This leads to a sensitivity difference between the center and periphery of the pixel area, generating shading.

SUMMARY OF THE INVENTION

The present invention provides a technique advantageous for planarizing the surface of an interlayer insulating film in a solid-state image sensor.

The first aspect of the present invention provides a solid-state image sensor including a pixel array area where a plurality of pixels are arranged, and a peripheral circuit area arranged outside the array area, each of the plurality of pixels including a photoelectric converter, and a transfer gate electrode which forms a channel for transferring charges generated by the photoelectric converter to a floating diffusion portion, the solid-state image sensor comprising: a first insulating film which is arranged to cover an upper surface of the photoelectric converter, at least part of an upper surface of the transfer gate electrode, and a side surface of the transfer gate electrode; a second insulating film which is arranged on a gate electrode of a MOS transistor arranged in the peripheral circuit area; and an interlayer insulating film which is arranged in contact with the first insulating film and the second insulating film.

Further features of the present invention will become apparent from the following description of exemplary embodiments with reference to the attached drawings.

BRIEF DESCRIPTION OF THE DRAWINGS

FIGS. 2A to 2E are sectional views exemplifying the sectional structure of a solid-state image sensor in the first embodiment of the present invention;

FIGS. 3A to 3E are sectional views showing a comparative example;

FIGS. 4A to 4E are sectional views exemplifying the sectional structure of a solid-state image sensor in the second embodiment of the present invention;

FIGS. 6A to 6E are sectional views exemplifying the sectional structure of a solid-state image sensor in the third embodiment of the present invention; and FIG. 7 is a plan view exemplifying the contact plug of a solid-state image sensor and its surroundings in the third embodiment of the present invention.

DESCRIPTION OF THE EMBODIMENTS

Figure 1:
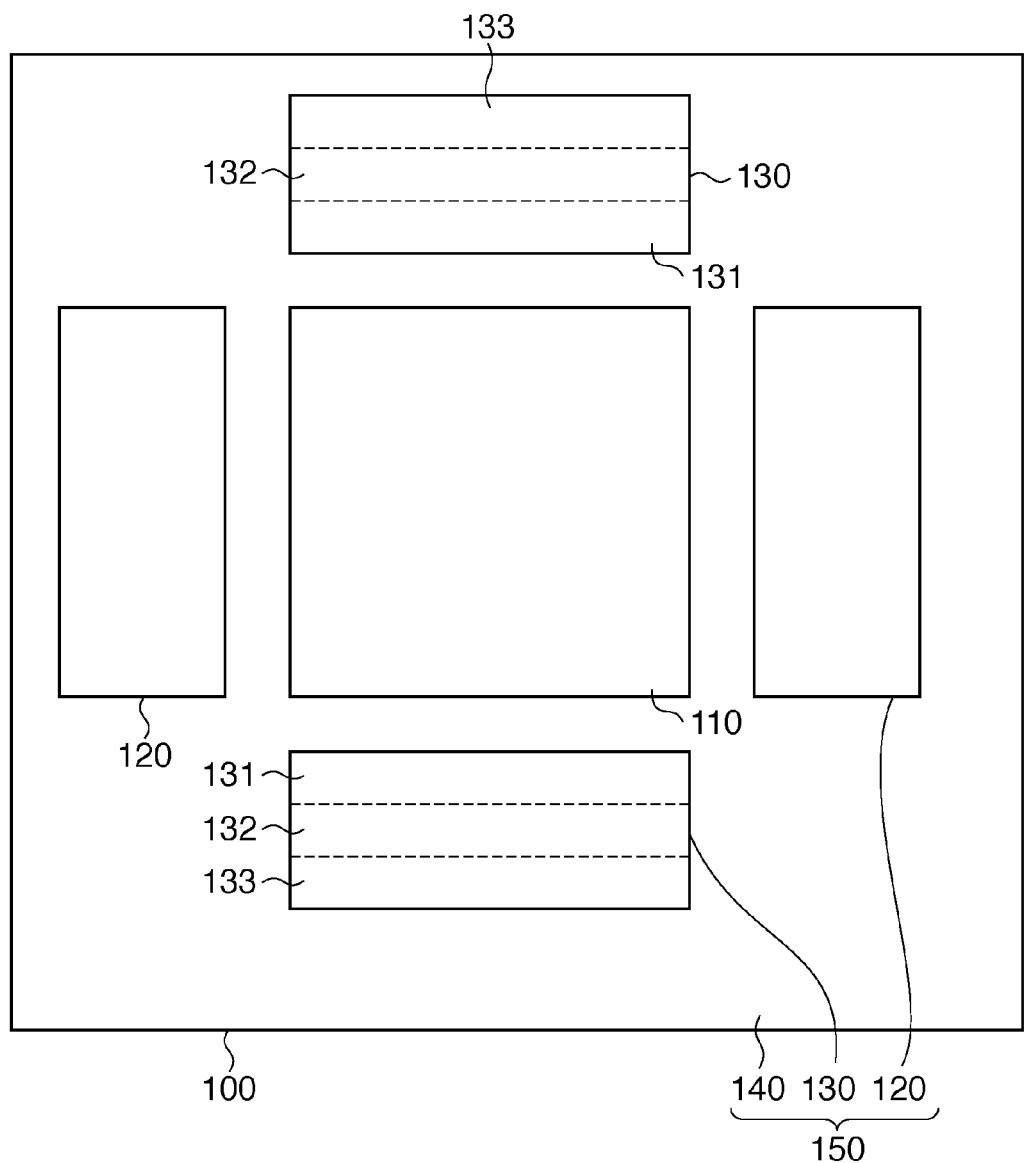
FIG. 1 is a plan view exemplifying the arrangement of a solid-state image sensor in an embodiment of the present invention.

The arrangement of a solid-state image sensor 100 in an embodiment of the present invention will be described with reference to FIG. 1. The solid-state image sensor 100 can include a pixel array area 110 where a plurality of pixels is arrayed two-dimensionally, and a peripheral circuit area 150 arranged outside the pixel array area 110. The pixel array area 110 includes a plurality of control lines (for example, transfer signal line and reset signal line) running in the row direction, and a plurality of column signal lines running in the column direction. Each pixel arrayed in the pixel array area 110 can include a photoelectric converter which converts incident light into charges, and a transfer gate electrode (transfer MOS transistor) which forms a channel for transferring charges generated by the photoelectric converter to a floating diffusion portion. Each row selecting circuit 120 drives the transfer gate electrode via the transfer signal line. The floating diffusion portion may be formed in each pixel or shared between a plurality of pixels. Each pixel or each group including a plurality of pixels which share the floating diffusion portion can include an amplification MOS transistor which outputs a signal corresponding to the voltage of the floating diffusion portion to the column signal line, and a reset MOS transistor which resets the voltage of the floating diffusion portion. The row selecting circuit 120 drives the reset MOS transistor via the reset signal line.

The peripheral circuit area 150 can include, for example, the row selecting circuits 120, readout circuits 130, and a low-density area 140. Each row selecting circuit 120 selects a row in the pixel array area 110 while driving a plurality of control lines (for example, transfer signal line, reset signal line, and row selection line). Each readout circuit 130 can include, for example, a readout circuit 131, switching circuit 132, and column selecting circuit 133. The low-density area 140 can include, for example, an input/output circuit. The readout circuit 131 includes a plurality of capacitive elements. The readout circuit 131 amplifies signals output from pixels in the pixel array area 110 via a plurality of column signal lines, and stores the amplified signals in a plurality of capacitive elements. The column selecting circuit 133 selects a column. The switching circuit 132 includes switches for outputting, to an output amplifier via a horizontal signal line (not shown), a signal stored in a capacitive element corresponding to a column selected by the column selecting circuit 133 among a plurality of capacitive elements arranged in the readout circuit 131.

A solid-state image sensor in the first embodiment of the present invention will be explained with reference to FIGS. 2A to 2E. FIGS. 2A to 2E are sectional views exemplifying part of the structures of the respective areas in the solid-state image sensor 100 shown in FIG. 1. The solid-state image sensor 100 is formed on a silicon substrate (semiconductor substrate) 20. FIG. 2A is a sectional view exemplifying the structure of a pixel in the pixel array area 110. FIG. 2B is a sectional view exemplifying the structure of part of the row selecting circuit 120 and column selecting circuit 133. FIG. 2C is a sectional view exemplifying the structure of part of the readout circuit 131. FIG. 2D is a sectional view exemplifying the structure of part of the switching circuit 132. FIG. 2E is a sectional view exemplifying the structure of part of the low-density area 140.

Each pixel can include a photoelectric converter 2a formed from a buried photodiode, a transfer MOS transistor 2b, an amplification MOS transistor 2c, and a reset MOS transistor (not shown). Each pixel can be formed on a P-type region 13 formed on the semiconductor region (for example, N-type semiconductor substrate) 20. The photoelectric converter 2a includes a diffusion region (N region) 2a-1 where charges are stored, and a diffusion region (P region) 2a-2 arranged on the surface side. A transfer gate electrode 4a serving as the gate electrode of the transfer MOS transistor 2b forms a channel below it for charge transfer. The reset MOS transistor can have the same structure as that of the amplification MOS transistor 2c. The transfer MOS transistor 2b, amplification MOS transistor 2c, and reset MOS transistor will be called intra-pixel MOS transistors. The intra-pixel MOS transistors include gate electrodes 4, the transfer gate electrode 4a, and a gate insulating film 14 and diffusion regions (for example, $N^+$ regions) 8 which are arranged below the gate electrodes 4 and transfer gate electrode 4a. The transfer gate electrode 4a and gate electrode 4 are formed from the same conductive material (for example, polysilicon) in the same step. P-type regions can be arranged below the diffusion regions 8 which are arranged to face each other via the photoelectric converter 2a of the transfer MOS transistor 2b and the gate electrode 4a.

The row selecting circuit 120 and column selecting circuit 133 can include a region where NMOS transistors 2d and PMOS transistors 2e exemplified in FIG. 2B are dense. The readout circuit 131 can include a region where capacitive elements 2f exemplified in FIG. 2C are dense. The switching circuit 132 can include a region where wiring patterns exemplified in FIG. 2D are dense. The low-density area 140 is a region where elements and patterns are arranged only at low density, as exemplified in FIG. 2E. The low-density area 140 can include a region where neither a circuit element nor pattern exists. The NMOS transistor 2d in the peripheral circuit area 150 is formed in a P-well 6, and includes the gate electrode 4, the gate insulating film 14 arranged below the gate electrode 4, and diffusion regions 8 and 10. The PMOS transistor 2e in the peripheral circuit area 150 is formed in an N-well 7, and includes the gate electrode 4, the gate insulating film 14 arranged below the gate electrode 4, and diffusion regions 9 and 11.

A first insulating film 3a is arranged to cover the upper surface of the photoelectric converter 2a, at least part of the upper surface of the transfer gate electrode 4a, its side surface, at least part of the upper surface of the gate electrode 4, and its side surface. Typically, the pixel array area 110 can be covered with the first insulating film 3a entirely except for a region where a contact plug and the like are arranged. The first insulating film 3a functions as a protective film which protects the photoelectric converter 2a. The first insulating film 3a can be, for example, one of (a) a silicon oxide film, (b) a silicon oxynitride film, (c) a silicon nitride film, and (d) a layered film of all or some of them. Considering the antireflection effect at the interface between the silicon substrate and the first insulating film, a two-layered structure in which a silicon nitride film is formed on a silicon substrate and a silicon oxide film or silicon oxynitride film is stacked on the silicon nitride film is preferable.

Isolation portions 5 isolate elements such as the MOS transistors, photoelectric converters, and capacitive elements from each other. The isolation portion 5 can have, for example, an STI (Shallow Trench Isolation) structure. A region surrounded by the isolation portion 5 is an active region where elements are formed. The diffusion region 8 is an $N^+$ region, and the diffusion region 10 is an $N^{++}$ region. The diffusion region 9 is a $P^+$ region, and the diffusion region 11 is a $P^{++}$ region.

The capacitive element 2f arranged in the readout circuit 131 has a structure in which an N region 12 is formed as a lower electrode in the P-well 6 and a conducive material pattern 4' is arranged as an upper electrode on an insulating film (not shown) on the N region 12. The capacitive element 2f has the diffusion region 8 electrically connected to the N region 12. The diffusion region 8 in the capacitive element 2f functions as the terminal of the lower electrode. The conducive material pattern 4' can be formed from the same conductive material (for example, polysilicon) as that of the transfer gate electrode 4a and gate electrode 4 in the same step. The switching circuit 132 has the conducive material pattern 4' as a wiring pattern. Note that the gate insulating film 14 can be arranged below the conducive material patterns 4' in the readout circuit 131 and switching circuit 132.

The peripheral circuit area 150 has a second insulating film 3b which is arranged on the upper surfaces of the gate electrodes 4 of the MOS transistors 2d and 2e arranged in the peripheral circuit area 150. The second insulating film 3b can be formed from the same material as that of the first insulating film 3a. Alternatively, the second insulating film 3b can be formed from a material that is different from that of the first insulating film 3a. Side walls 3c are formed on the side surfaces of the gate electrodes 4 of the MOS transistors 2d and 2e. The side wall 3c may be formed from the same material as that of the first insulating film 3a and second insulating film 3b, or another material. The side wall 3c can be formed only on one of the two side surfaces of the gate electrode 4.

The peripheral circuit area 150 can have a third insulating film 3d which is arranged on the upper surface of the conducive material pattern 4' serving as the upper electrode of the capacitive element 2f arranged in the peripheral circuit area 150. Further, the third insulating film 3d may cover a region around the conducive material pattern 4' serving as the upper electrode of the capacitive element 2f. The third insulating film 3d can be formed from the same material as that of the first insulating film 3a and second insulating film 3b.

The peripheral circuit area 150 can have a fourth insulating film 3e which is arranged on the upper surface of the conducive material pattern 4' serving as a wiring pattern arranged in the switching circuit 132. Further, the fourth insulating film 3e may cover the semiconductor substrate 20 around the conducive material pattern 4' serving as a wiring pattern arranged in the switching circuit 132. The fourth insulating film 3e can be formed from the same material as that of the first insulating film 3a and second insulating film 3b. Also, the peripheral circuit area 150 can have a fifth insulating film 3f to cover the semiconductor substrate 20 in the low-density area

140. The fifth insulating film 3f can be formed from the same material as that of the first insulating film 3a and second insulating film 3b. Typically, the insulating films 3a, 3b, 3d, 3e, and 3f and the side wall 3c are formed from the same material. An interlayer insulating film 16 is formed in contact with the insulating films 3a, 3b, 3d, 3e, and 3f and the side wall 3c to cover the insulating films 3a, 3b, 3d, 3e, and 3f and the side wall 3c. The surface of the interlayer insulating film 16 is planarized by CMP. Note that the insulating films 3d, 3e, and 3f are arbitrary building components. This is because even the readout circuit 131 and switching circuit 132 include MOS transistors, and the second insulating film 3b is formed even on the gate electrodes of the MOS transistors and contributes to the planarization.

The above-described structure can decrease the coverage difference (density difference) of the semiconductor substrate caused by insulating layers including the insulating films 3a, 3b, 3d, 3e, and 3f (to also be referred to as an insulating film 3 at once), reducing the step between the pixel array area 110 and the peripheral circuit area 150. As a result, the flatness of the surface of the interlayer insulating film 16 improves, and for example, the sensitivity difference between the center and periphery of the pixel array area 110 decreases, improving shading.

As exemplified in FIG. 2B, the side walls 3c can be formed on the side surfaces of the gate electrodes 4 of the MOS transistors 2d and 2e in the peripheral circuit area 150. The MOS transistors 2d and 2e can take an LDD structure by implanting ions into the P-well 6 and N-well 7 (or semiconductor substrate 20) via the gate electrodes 4 and side walls 3c. The NMOS transistor 2d has the gate electrode 4 and gate insulating film 14, and has, as the source/drain regions, the $N^{++}$ diffusion regions 10 and the $N^+$ diffusion regions 8 lower in concentration than the $N^{++}$ diffusion regions 10. The PMOS transistor 2e has the gate electrode 4 and gate insulating film 14, and has, as the source/drain regions, the $P^{++}$ diffusion regions 11 and the $P^+$ diffusion regions 9 lower in concentration than the $P^{++}$ diffusion regions 11.

In one embodiment, the maximum coverage (density) by the insulating film 3a in the pixel array area 110 can be almost 100%. The coverage (density) by the insulating film 3b in the row selecting circuit 120 and column selecting circuit 133 can be 20% to 30% of the entire area of the row selecting circuit 120 and column selecting circuit 133. The coverage by the insulating film 3d in the readout circuit 131 can be 50% to 60% of the entire area of the readout circuit 131. The coverage by the insulating film 3e in the switching circuit 132 can be almost 100% of the entire area of the switching circuit 132.

FIGS. 3A to 3E are sectional views showing a comparative example. In the comparative example shown in FIGS. 3A to 3E, insulating films equivalent to the insulating films 3b, 3d, and 3e are not arranged on the gate electrode 4 and conducive material pattern 4' in the peripheral circuit area 150 including the row selecting circuit 120, readout circuit 131, switching circuit 132, column selecting circuit 133, and low-density area 140. In contrast, the insulating film 3a is arranged in the pixel array area 110. For this reason, after the interlayer insulating film 16 is deposited, a large step is formed on its surface, leaving a rather large step even after planarizing the surface of the interlayer insulating film 16 by CMP.

Arranging the insulating film 3 on the gate electrode 4 and conducive material pattern 4' arranged in the peripheral circuit area 150, as shown in FIGS. 2A to 2E, can equalize levels in the pixel array area 110 and peripheral circuit area 150 below the interlayer insulating film 16. This also contributes to reduction of the global step.

A solid-state image sensor in the second embodiment of the present invention will be explained with reference to FIGS. 4A to 4E. Note that matters not mentioned in the second embodiment can follow the first embodiment. In the second embodiment, the width (area) of a second insulating film 3b arranged on a gate electrode 4 of each of MOS transistors 2d and 2e in a peripheral circuit area 150 is smaller than the width (area) of the gate electrode 4. This structure is useful for solving a problem that it is difficult to implant ions near the gate electrodes 4 of the MOS transistors 2d and 2e because the second insulating film 3b functions as a mask in formation of diffusion regions 8 and 9. In particular, this structure is beneficial when implanting ions obliquely with respect to a direction perpendicular to the surface of a semiconductor substrate 20. This also applies to a capacitive element. The width (area) of a third insulating film 3d arranged on the upper surface of a conducive material pattern 4' serving as the upper electrode of a capacitive element 2f is desirably set smaller than the width (area) of the conducive material pattern 4'. This also applies to a fourth insulating film 3e which is arranged on the upper surface of the conducive material pattern 4' serving as a wiring pattern arranged in a switching circuit 132.

The width of the second insulating film 3b on the gate electrode 4 of each of the MOS transistors 2d and 2e and the width (area) of the third insulating film 3d on the conducive material pattern 4' of the capacitive element 2f are desirably maximized as long as the aforementioned problem in ion implantation can be solved. This can decrease the difference of the coverage by an insulating film 3 between a pixel array area 110 and the peripheral circuit area 150.

Figure 5:
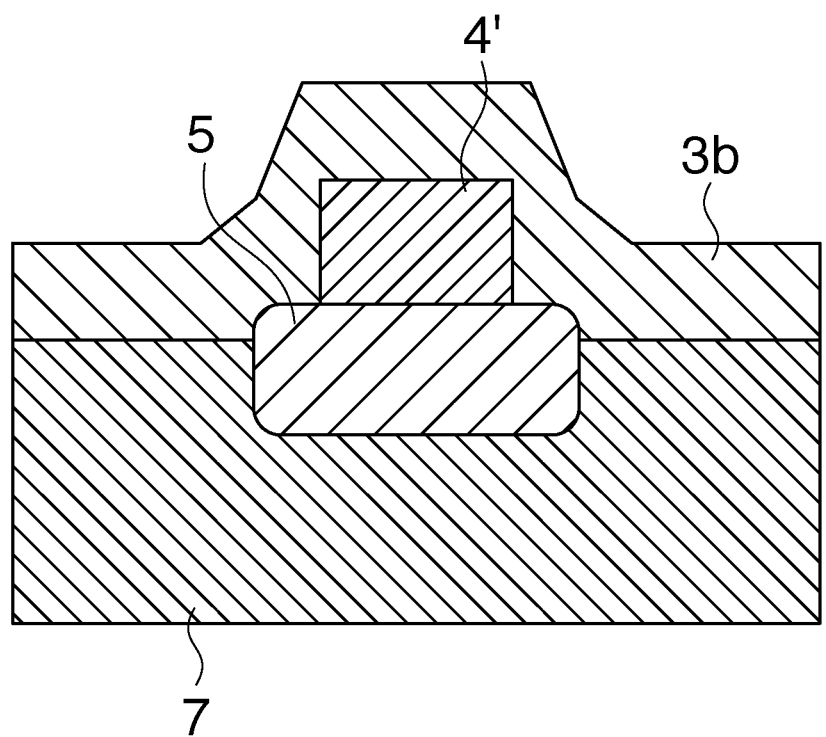
FIG. 5 is a sectional view exemplifying a conducive material pattern arranged on an isolation portion and its surrounding structure.

FIG. 5 is a sectional view exemplifying the conducive material pattern 4' arranged on an isolation portion 5 arranged in an N-well 7 and its surrounding structure. The second insulating film 3b covers the upper and side surfaces of the conducive material pattern 4' arranged on the isolation portion 5, and further a portion around the conducive material pattern 4'. This is because the conducive material pattern 4' arranged on the isolation portion 5 need not function as a mask in ion implantation to form a source and drain. As for the second insulating film 3b arranged on the conducive material pattern 4' arranged on the isolation portion 5, its width (area) may be set smaller than the width (area) of the conducive material pattern 4'.

In addition to the effects of the first embodiment, the second embodiment can provide an additional effect capable of reducing shadowing generated by the insulating film 3 in ion implantation.

A solid-state image sensor in the third embodiment of the present invention will be explained with reference to FIGS. 6A to 6E and 7. FIGS. 6A to 6E are sectional views exemplifying part of the structures of respective areas in a solid-state image sensor 100. FIG. 7 is a plan view showing a contact plug and its surroundings in FIGS. 6A to 6E. Note that matters not mentioned in the third embodiment can follow the first or second embodiment. The third embodiment will explain a contact hole & contact plug formation step after the steps described in the first or second embodiment.

Assume that an insulating film 3, that is, 3a, 3b, 3c, 3d, 3e, or 3f is a layered film of a silicon nitride film and silicon oxide film effective for antireflection, and a gate electrode 4 and conducive material pattern 4' are formed from polysilicon. Also assume that an interlayer insulating film 16 is a silicon oxide film. It needs to be devised to electrically connect a contact plug 15 to the polysilicon gate electrode 4 and conducive material pattern 4'. This is because etching gas capable of etching a silicon oxide film is used to form a contact hole in the silicon oxide film which forms the interlayer insulating film 16. In general, this gas does not etch a silicon nitride film, and a silicon nitride film which forms the insulating film 3 remains on the contact region of the polysilicon gate electrode 4 and conducive material pattern 4'. The silicon nitride film left disables electrical connection between the contact plug 15 and the gate electrode 4 and conducive material pattern 4'.

To solve this, in the third embodiment, the first insulating film 3a has an opening above a transfer gate electrode 4a, the contact plug 15 is connected to the transfer gate electrode 4a through the opening, and the area of the opening is larger than the bottom area of the contact plug 15. Similarly, the first insulating film 3a has an opening above the gate electrode 4, the contact plug 15 is connected to the gate electrode 4 through the opening, and the area of the opening is larger than the bottom area of the contact plug 15. Also, the second insulating film 3b has an opening above the gate electrode 4 in a peripheral circuit area 150, the contact plug 15 is connected to the gate electrode 4 through the opening, and the area of the opening is larger than the bottom area of the contact plug 15. Similarly, the third insulating film 3c has an opening above the conducive material pattern 4' in the peripheral circuit area 150, the contact plug 15 is connected to the conducive material pattern 4' through the opening, and the area of the opening is larger than the bottom area of the contact plug 15.

In this case, the opening of the insulating film 3, that is, 3a, 3b, 3c, 3d, 3e, or 3f can be formed simultaneously when an unnecessary part of an insulator is removed after the insulator for forming the insulating film 3 is deposited on the entire surface of a semiconductor substrate 20.

As an application of the solid-state image sensor according to each of the above embodiments, a camera in which the solid-state image sensor is assembled will be exemplified. The concept of the camera is not limited to an apparatus whose primary purpose is photographing, but also includes an apparatus having a photographing function as an accessory (for example, a personal computer or cell phone). The camera includes the solid-state image sensor according to the present invention exemplified as the embodiment, and a processing unit which processes a signal output from the solid-state image sensor. The processing unit can include, for example, an A/D converter, and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-150252, filed Jun. 30, 2010, which is hereby incorporated by reference herein in its entirety.

What is claimed is:

1. A solid-state image sensor comprising:
a plurality of pixels arranged in a pixel array area;
a peripheral circuit arranged outside said pixel array area;
a photoelectric converter arranged in said pixel array area;
an amplification MOS transistor arranged in said pixel array area and having a gate electrode, said amplification MOS transistor outputting a signal according to charges generated by said photoelectric converter;
a peripheral MOS transistor arranged in said peripheral circuit area, said peripheral MOS transistor having a gate electrode;
an interlayer insulating film arranged to cover said photoelectric converter, said amplification MOS transistor and said peripheral MOS transistor, said interlayer insulating film being planarized by chemical metal polishing ("CMP");
a first insulating film arranged between said interlayer insulating film and an upper surface of said gate electrode of said amplification MOS transistor, said first insulating film extending to cover said photoelectric converter and a side surface of said gate electrode of said amplification MOS transistor without a side wall between said first insulating film and said side surface of said gate electrode of said amplification MOS transistor, and
a second insulating film arranged between said interlayer insulating film and an upper surface of said gate electrode of said peripheral MOS transistor.

2. The sensor according to claim 1, wherein said first insulating film and said second insulating film include the same material and said material is different from a material of said interlayer insulating film.

3. The sensor according to claim 1, further comprising a side wall which is arranged on a side surface of said gate electrode of said peripheral MOS transistor,
wherein said peripheral MOS transistor has an LDD structure.

4. The sensor according to claim 1, wherein an area of said second insulating film on said upper surface of the gate electrode of said peripheral MOS transistor is smaller than an area of said upper surface of said gate electrode of said peripheral MOS transistor.

5. The sensor according to claim 1, further comprising a third insulating film which is arranged on an upper surface of a conductive material pattern arranged in said peripheral circuit area,
wherein said conductive pattern includes the same material as a material of said gate electrode of said peripheral MOS transistor, and said third insulating film includes the same material as said material of said second insulating film.

6. The sensor according to claim 1, wherein said interlayer insulating film has a contact hole and said second insulating film has an opening, a contact plug connected to said gate electrode of said peripheral MOS transistor is disposed in said contact hole through said opening, and an area of said opening is larger than an area of said contact hole.

7. A camera comprising:
a solid-state image sensor according to claim 1; and
a processor which processes a signal output from said solid-state image sensor.

8. The sensor according to claim 1, wherein said first insulating film covers a plurality of photoelectric converters over said plurality of pixels.

9. The sensor according to claim 1, wherein said first insulating film and said second insulating film include at least one of a silicon nitride and a silicon oxynitride.

10. The sensor according to claim 1, wherein at least one of said first insulating film and said second insulating is a layered film including a silicon oxide.

11. The sensor according to claim 1, wherein said first insulating film includes a silicon oxide layer and a silicon nitride layer, said silicon nitride layer being positioned between said silicon oxide layer and said photoelectric converter.

12. A solid-state image sensor comprising:
a plurality of pixels arranged in a pixel array area;
a peripheral circuit arranged outside said pixel array area;
a photoelectric converter arranged in said pixel array area;

an amplification MOS transistor arranged in said pixel array area and having a gate electrode, said amplification MOS transistor outputting a signal according to charges generated by said photoelectric converter;

a peripheral MOS transistor arranged in said peripheral circuit area and having a gate electrode, said peripheral MOS transistor having an LDD structure;

a side wall arranged on a side surface of said gate electrode of said peripheral MOS transistor;

an interlayer insulating film arranged to cover said photoelectric converter, said amplification MOS transistor and said peripheral MOS transistor, said interlayer insulating film being planarized by CMP;

a first insulating film arranged between said interlayer insulating film and an upper surface of said gate electrode of said amplification MOS transistor and extending to cover said photoelectric converter and a side surface of said gate electrode of said amplification MOS transistor; and a second insulating film arranged between said interlayer insulating film and an upper surface of said gate electrode of said peripheral MOS transistor, a distance from the side surface of said gate electrode of said amplification MOS transistor to a portion of said first insulating film, said portion being nearest to said side surface of said gate electrode of said amplification MOS transistor, is smaller than a thickness of said side wall.

13. The sensor according to claim 12, wherein said first insulating film is arranged between said interlayer insulating film and a diffusion region of said amplification MOS transistor, a distance from said diffusion region of said amplification MOS transistor to the upper face of said first insulating film being smaller than a thickness of said gate electrode of said amplification MOS transistor.

14. The sensor according to claim 12, further comprising a transfer gate electrode arranged in said pixel array area, said transfer gate electrode forming a channel for transferring the charges, wherein a distance from said photoelectric converter to an upper face of said first insulating film is smaller than a thickness of said transfer gate electrode.

15. The sensor according to claim 12, wherein a distance from a diffusion region of said peripheral MOS transistor to said interlayer insulating film is smaller than a distance from the upper surface of said gate electrode of said peripheral MOS transistor to said interlayer insulating film.

16. The sensor according to claim 12, wherein a distance from a diffusion region of said peripheral MOS transistor to said interlayer insulating film is smaller than a distance from said diffusion region of said amplification MOS transistor to said interlayer insulating film.

17. The sensor according to claim 12, wherein said first insulating film covers a plurality of photoelectric converters over said plurality of pixels.

18. The sensor according to claim 12, wherein said first insulating film and said second insulating film include the same material and said material is different from a material of said interlayer insulating film.

19. The sensor according to claim 12, wherein an area of said second insulating film on the upper surface of said gate electrode of said peripheral MOS transistor is smaller than an area of the upper surface of said gate electrode of said peripheral MOS transistor.

20. A camera comprising:
   a solid-state image sensor according to claim 12; and
   a processor which processes a signal output from said solid-state image sensor.

\* \* \* \* \*